(12) United States Patent
Safai

(10) Patent No.: US 11,515,466 B2
(45) Date of Patent: Nov. 29, 2022

(54) BURST ENERGY RELEASE FOR READ-WRITE SENSORS

(71) Applicant: THE BOEING COMPANY, Chicago, IL (US)

(72) Inventor: Morteza Safai, Newcastle, WA (US)

(73) Assignee: THE BOEING COMPANY, Chicago, IL (US)

(*) Notice: Subject to any disclaimer, the term of this patent is extended or adjusted under 35 U.S.C. 154(b) by 911 days.

(21) Appl. No.: 16/373,156

(22) Filed: Apr. 2, 2019

(65) Prior Publication Data

US 2020/0321515 A1 Oct. 8, 2020

(51) Int. Cl.
| | |
|---|---|
| *H01L 41/08* | (2006.01) |
| *H01L 41/113* | (2006.01) |
| *H02N 2/18* | (2006.01) |
| *H03K 17/975* | (2006.01) |

(52) U.S. Cl.
CPC .......... *H01L 41/1132* (2013.01); *H02N 2/18* (2013.01); *H02N 2/186* (2013.01); *H03K 17/975* (2013.01)

(58) Field of Classification Search
CPC ....... H01L 41/1132; H01L 41/08; H02N 2/18; H03K 17/975; G06F 3/033; G09G 5/08; G09G 5/00; G06G 3/02
See application file for complete search history.

(56) References Cited

U.S. PATENT DOCUMENTS

| | | | | |
|---|---|---|---|---|
| 9,197,143 | B1* | 11/2015 | Townsend | H02J 50/001 |
| 10,340,700 | B2* | 7/2019 | Frenila | H02J 50/001 |
| 10,855,101 | B2* | 12/2020 | Jung | H02J 7/345 |
| 2011/0101789 | A1* | 5/2011 | Salter, Jr. | H02M 7/217 |
| | | | | 307/104 |

* cited by examiner

*Primary Examiner* — Pegeman Karimi
(74) *Attorney, Agent, or Firm* — Marshall, Gerstein & Borun LLP

(57) ABSTRACT

Systems and methods of providing power to high-voltage sensors in power-limited environments through environmental energy harvesting are disclosed. The systems and methods are configured to intermittently power high-voltage sensors by repeatedly releasing stored energy in bursts. An environmental energy harvesting device generates a low-voltage power supply and is coupled to one or more capacitors to charge the capacitors to a high-voltage threshold. After such high-voltage threshold has been reached, the capacitors are discharged to provide a high-voltage power burst to a high-voltage sensor configured to inspect a component and generate an inspection result signal. The inspection result signal is received by an output module, which may further store or transmit to an external receiver a data signal indicating the inspection results.

20 Claims, 5 Drawing Sheets

BURST ENERGY RELEASE FOR READ-WRITE SENSORS

FIELD

This disclosure relates to systems and methods of powering sensors in power-limited environments using environmental energy harvesting by burst energy release.

BACKGROUND

Nondestructive inspection sensors have been developed that are capable of detecting defects in components. Such sensors can be configured to operate constantly for long periods of time when supplied with electrical power. Although some environments allow easy access to stable high-voltage power sources, application of nondestructive inspection sensors in power-limited environments would be advantageous if sufficient power could be supplied to operate the sensors. As an example, piezoelectric sensors could be beneficially deployed to detect or monitor the growth of cracks, pits, or other defects in vehicle components (e.g., aircraft body surfaces or brakes on trains or automobiles), but power limitations currently prevent such deployment.

SUMMARY

An example includes a method for intermittent inspection of a component, comprising: generating, by an environmental energy harvesting device, a low-voltage power supply from energy in an environment of the component; charging a capacitor disposed on a surface of the component to a high-voltage threshold using the low-voltage power supply during a charging interval; powering a nondestructive inspection sensor with a high-voltage power burst by discharging the capacitor during a discharging interval following the charging interval, wherein the nondestructive inspection sensor is disposed on the surface of the component and configured to transmit and receive an inspection signal that propagates along or through a portion of the component when powered; and receiving, at an output module, an inspection result signal associated with the portion of the component from the nondestructive inspection sensor. Such method may further comprise storing and/or transmitting inspection results based upon the inspection result signal.

Another example includes an intermittent inspections system, comprising: an environmental energy harvesting device disposed on a surface of a component and configured to generate a low-voltage power supply from energy in an environment of the component; a capacitor disposed on the surface of the component and connected to the environmental energy harvesting device; an electronic switch disposed on the surface of the component and connected to the capacitor, wherein the electronic switch is configured to control charging and discharging of the capacitor such that: (i) while the electronic switch is open during a charging interval, the capacitor charges to at least a high-voltage threshold using the low-voltage power supply from the environmental energy harvesting device, and (ii) while the electronic switch is closed during a discharging interval following the charging interval, the capacitor discharges a high-voltage power burst through the electronic switch; a nondestructive inspection sensor disposed on the surface of the component and connected to the electronic switch, wherein the nondestructive inspection sensor is configured to transmit and receive an inspection signal that propagates along or through a portion of the component when powered by the high-voltage power burst from the capacitor through the electronic switch; and an output module disposed on the surface of the component and connected to the nondestructive inspection sensor, wherein the output module is configured to receive an inspection result signal associated with the portion of the component from the nondestructive inspection sensor. The capacitor may comprise a plurality of graphene layers stacked in a flexible film attached to the surface of the component and configured to operate as a capacitor bank. Such system may further comprise a control module disposed on the surface of the component and connected to the electronic switch to control opening and closing the electronic switch.

Yet another example includes a power circuit for intermittently powering a nondestructive inspection sensor, comprising: an environmental energy harvesting device disposed on a surface of a component and configured to generate a low-voltage power supply from energy in an environment of the component; a capacitor disposed on the surface of the component and connected to the environmental energy harvesting device; and an electronic switch disposed on the surface of the component and connected to the capacitor, wherein the electronic switch is configured to control charging and discharging of the capacitor such that: (i) while the electronic switch is open during a charging interval, the capacitor charges to at least a high-voltage threshold using the low-voltage power supply from the environmental energy harvesting device, and (ii) while the electronic switch is closed during a discharging interval following the charging interval, the capacitor discharges a high-voltage power burst to the nondestructive inspection sensor through the electronic switch.

The features, functions, and advantages that have been discussed can be achieved independently in various embodiments or may be combined in yet other embodiments further details of which can be seen with reference to the following description and drawings.

DESCRIPTION

Figure 1:
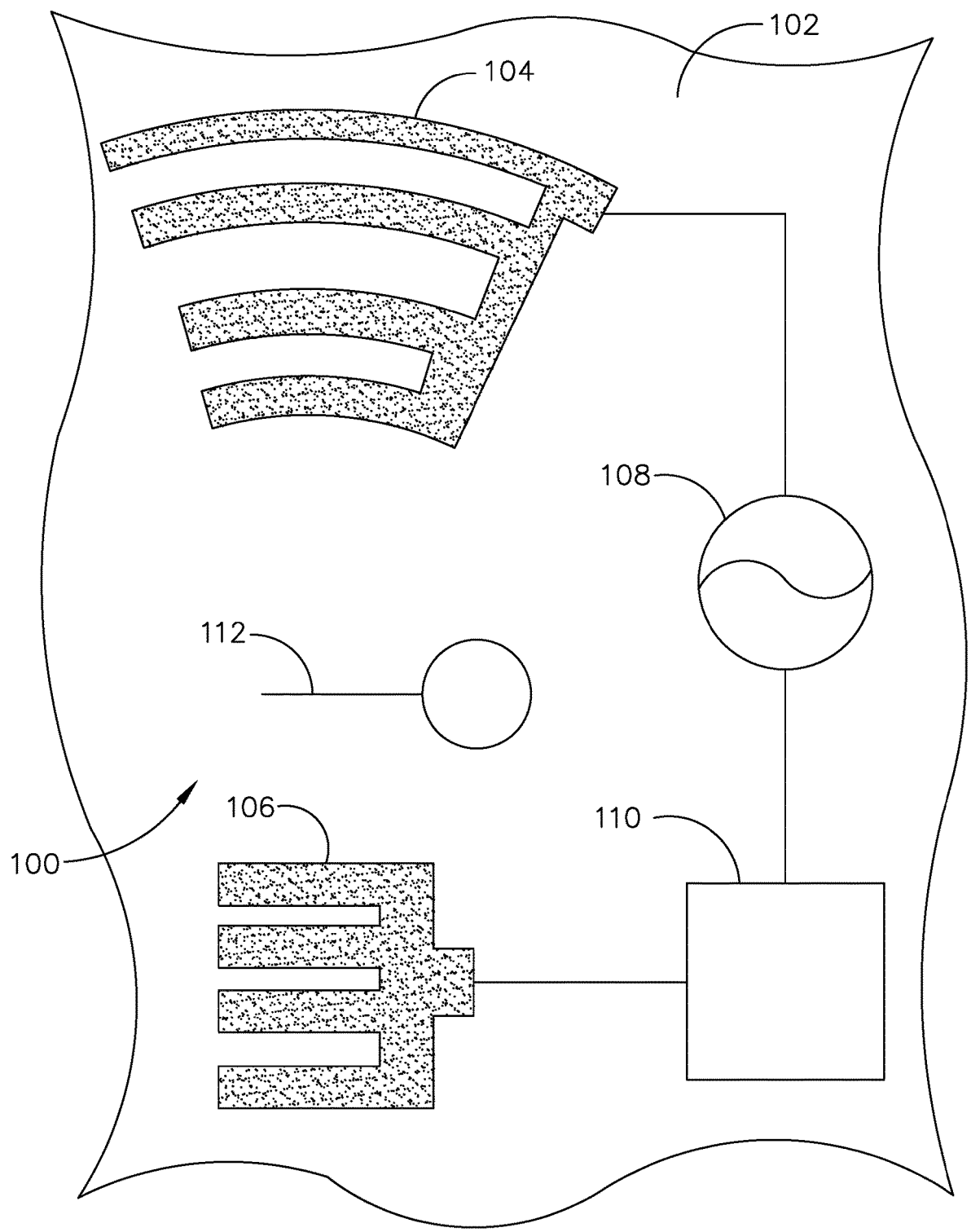
FIG. 1 illustrates a block diagram of a piezoelectric sensor configured for nondestructive inspection of a surface.

FIG. 1 illustrates a block diagram of an example of a piezoelectric sensor 100 configured for nondestructive inspection of a surface 102. The piezoelectric sensor 100 comprises a transmitter structure 104 and a receiver structure 106 disposed on the surface 102 and separated by a distance along the surface 102. Both the transmitter structure 104 and the receiver structure 106 are made of a piezoelectric material. When provided with a high-voltage (e.g., on the order of one hundred volts) power signal, the transmitter structure 104 generates an ultrasonic wave that propagates along the surface 102 to the receiver structure 106. As the ultrasonic wave reaches the receiver structure 106, the motion induces an electrical current in the receiver structure 106. When a defect 112 is present in the surface 102, the ultrasonic wave received at the receiver structure 106 is correspondingly distorted by the interaction of the wave with the defect 112. Thus, the piezoelectric sensor 100 allows real-time and continuous monitoring of at least a portion of the surface 102 between the transmitter structure 104 and the receiver structure 106 when the piezoelectric sensor 100 is powered with a high-voltage power signal.

In the illustrated example, the powered signal generator 108 provides a high-voltage power signal to the piezoelectric sensor 100 and also provides a reference signal to a comparator 110. The powered signal generator 108 must receive high-voltage power from a power source (not shown) in order to generate the high-voltage power signal provided to the transmitter structure 104. Such high-voltage power signals must be provided at a frequency and power level corresponding to the geometry and characteristics of the piezoelectric sensor 100. The comparator 110 may include an oscilloscope or other circuitry for comparison of the electrical signal received from the receiver structure 106 and the reference signal received from the powered signal generator 108, with an appropriate delay if needed.

Although the piezoelectric sensor 100 described above provides nondestructive inspection of a surface and can be manufactured with a form factor appropriate to many uses, the high-voltage power requirement of such sensors limit their use in many environments. Vehicles, remote structures (e.g., bridges), and other remote or mobile objects present particular difficulty for nondestructive inspection using sensors such as the piezoelectric sensor 100. Particularly in power-limited environments where weight or size of the power components are likewise limited, power considerations have previously prevented use of such nondestructive inspection techniques.

Disclosed herein are systems, methods, and circuits for using low-voltage power harvested from the environment to provide intermittent high-voltage power to a sensor for inspection of a component. The techniques disclosed herein may be advantageously used to provide high-voltage power bursts to power nondestructive sensors similar to the piezoelectric sensor 100 by harvesting and storing energy in the sensor environment. The systems and circuits disclosed herein may also be constructed of thin or low-profile elements to limit disruption of the operation of the inspected component, particularly where the inspected component is designed to move within or through an environment.

Figure 2:
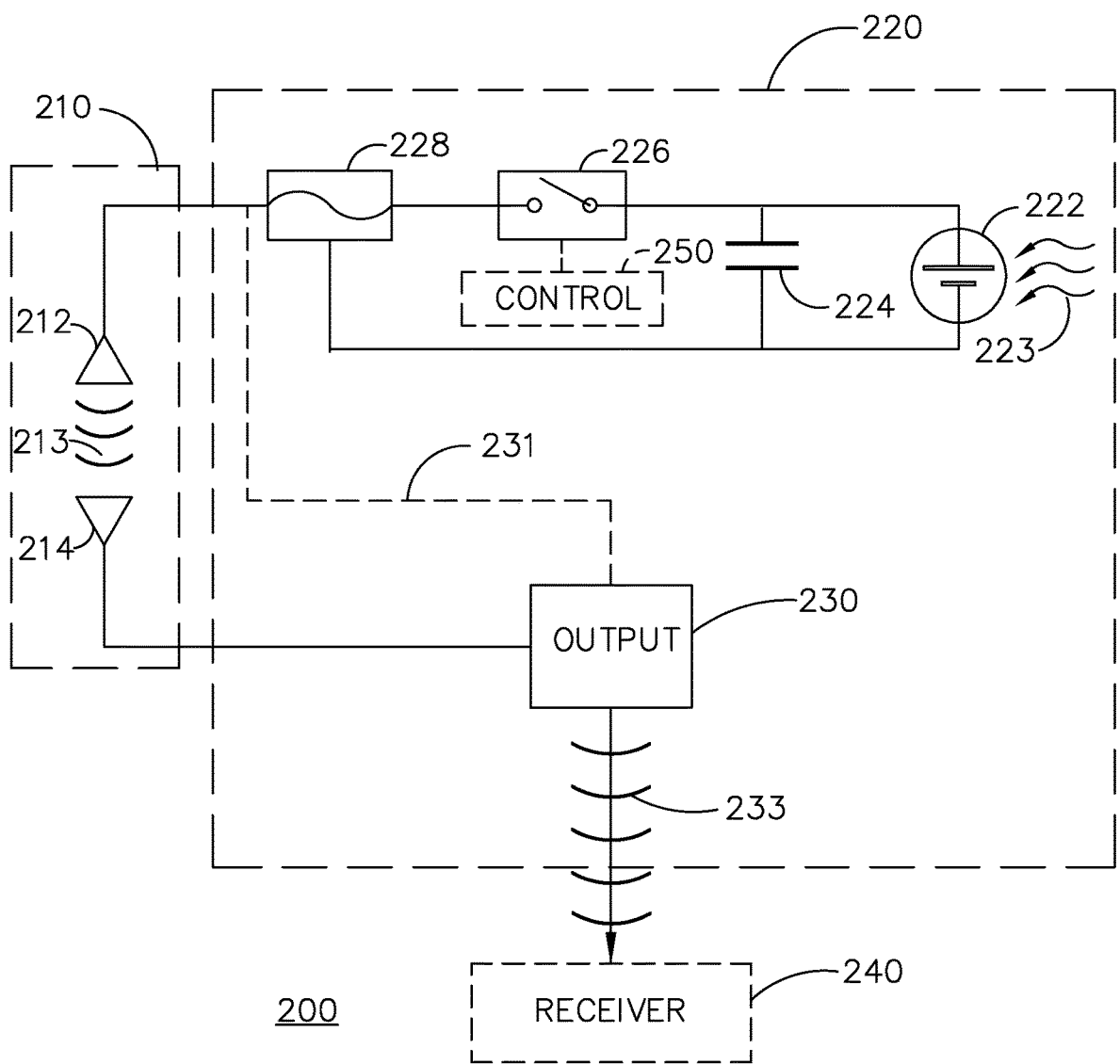
FIG. 2 illustrates a block diagram of an intermittent inspection system including a nondestructive inspection sensor and a power circuit.

FIG. 2 illustrates a block diagram of an example of an intermittent inspection system 200 including a nondestructive inspection sensor 210 and a power circuit 220. The power circuit 220 generates low-voltage power from the environment and supplies high-voltage power to the nondestructive inspection sensor 210. The power circuit 220 provides such high-voltage power to the nondestructive inspection sensor 210 intermittently, in short high-voltage power bursts, rather than continuously. When powered, the nondestructive inspection sensor 210 inspects a component on which the nondestructive inspection sensor 210 is disposed and generates an inspection result signal as an output. The nondestructive inspection sensor 210 provides the nondestructive result signal to an output module 230, which output module 230 may be part of the power circuit 220 or may be a separate element in the intermittent inspection system 200. All elements of the intermittent inspection system 200 are configured to be disposed on or near a surface of a component to be inspected. Although one exemplary configuration of the intermittent inspection system 200 is described herein, elements of the intermittent inspection system 200 may be arranged or grouped in various alternative configurations.

The nondestructive inspection sensor 210 may be any type of electrically powered sensor requiring a high-voltage power supply relative to the power available in the environment. For example, the nondestructive inspection sensor 210 may be a piezoelectric sensor 100 disposed on a surface 102, as described above with respect to FIG. 1. The nondestructive inspection sensor 210 comprises a transmission transducer 212 configured to generate the inspection signal 213 at a first part of the surface of the component to be inspected and a receiving transducer 214 configured to receive the inspection signal 213 at a second part of the surface of the component to be inspected. The inspection signal 213 is generated at the first part of the surface by the transmission transducer 212 and travels on or through the component to be inspected to the second part of the surface, where it is detected by the receiving transducer 214. In some embodiments, either or both of the transmission transducer 212 and the receiving transducer 214 are piezoelectric transducers, such as the transmitter structure 104 and the receiver structure 106 of the piezoelectric sensor 100. In further embodiments the inspection signal 213 is an ultrasonic pulse generated by the transmission transducer 212.

The power circuit 220 is connected to the nondestructive inspection sensor 210 to provide power to the nondestructive inspection sensor 210 and, in some embodiments, to receive an inspection result signal from the nondestructive inspection sensor 210. The power circuit includes at least an environmental energy harvesting device 222 to generate a low-voltage power supply from environmental energy 223, a capacitor 224 to store energy from the low-voltage power supply, and an electronic switch 226 to control charging and discharging of the capacitor 224. In some embodiments, the power circuit 220 further includes any one or more of the following additional elements: a signal generator 228 to provide an appropriate power signal to the transmission transducer 212, a control module 250 configured to control operation of the electronic switch 226, and/or an output module 230 configured to receive the inspection result signal from the receiving transducer 214.

The environmental energy harvesting device 222 is disposed on a surface of a component to be inspected and configured to generate a low-voltage power supply from environmental energy 223 in an environment of the component to be inspected. The environmental energy harvesting device 222 may be any device configured to convert environmental energy 223 (e.g., light, heat, or vibration) into electrical energy. In some embodiments, the environmental energy harvesting device 222 is an electromechanical device configured to generate the low-voltage power supply from vibrations of the component to be inspected. For example, a cantilevered magnetic generator, a cantilevered piezoelectric generator, a photovoltaic cell, or other similar small-scale energy harvesting devices may be used. The low-voltage power supply generated by environmental energy harvesting devices 222 that are small enough to be practically used on vehicles or many remote structures is near or below one volt, with correspondingly lower current. Therefore, the power generated by the environmental energy harvesting device 222 is used to charge a capacitor 224 in order to achieve the higher voltage levels needed to operate the nondestructive inspection sensor 210.

The capacitor 224 is disposed on the surface of the component to be inspected and is connected to the environmental energy harvesting device 222 to receive and store the low-voltage power supply generated by the environmental energy harvesting device 222. Although referred to herein as a single capacitor, multiple capacitors arranged in a capacitor bank may instead be used. For inspection of components on vehicles (particularly aircraft), the size and weight of the capacitor 224 should be limited. Therefore, in some embodiments, the capacitor 224 is a flexible film capacitor having high capacitance, such as graphene-based capacitors. In some such embodiments, the capacitor 224 comprises a plurality of graphene layers stacked in a flexible film attached to the surface of the component to be inspected and configured to operate as a capacitor bank. Such graphene-layer capacitor 224 has the additional advantages of low weight and low profile, thereby being minimally disruptive of the ordinary operation of the component on which it is disposed. Charging and discharging of the capacitor 224 is controlled by the electronic switch 226, through which the capacitor 224 is connected to the nondestructive inspection sensor 210.

The electronic switch 226 is disposed on the surface of the component to be inspected and is connected to the capacitor 224. The electronic switch 226 is configured to control charging of the capacitor 224 during a charging interval and discharging of the capacitor 224 during a discharging interval following the charging interval. While the electronic switch 226 is open during the charging interval, the capacitor 224 charges to at least a charge associated with a high-voltage threshold using the low-voltage power supply from the environmental energy harvesting device 222. The electronic switch 226 is then closed to enable current to pass through the electronic switch 226. While the electronic switch 226 is closed during the discharging interval, the capacitor 224 discharges a high-voltage power burst through the electronic switch 226. Although described herein as a switch, those of ordinary skill in the art will understand that the electronic switch 226 is not required to be a physical switch and that various types of devices may be used to perform switching, including transistors.

In some embodiments, the electronic switch 226 is configured to automatically close when the capacitor 224 is sufficiently charged. In other embodiments, the electronic switch 226 is controlled by a control module 250. The control module 250 is disposed on the surface of the component to be inspected and is connected to the electronic switch 226 to control operation of the electronic switch 226. The control module 250 controls opening and closing the electronic switch 226 according to logic or circuitry in the control module 250. For example, the control module 250 may contain a timer to periodically close the electronic switch 226 for a set discharging period after passage of a predetermined charging period.

The electronic switch 226 is connected to the nondestructive inspection sensor 210 to provide short bursts of high-voltage power to the nondestructive inspection sensor 210 from the capacitor 224 when the electronic switch 226 is closed. In some embodiments, the electronic switch 226 is connected to the nondestructive inspection sensor 210 through a signal generator 228. The signal generator 228 is configured to generate and provide a high-voltage periodic signal (e.g., a sinusoidal alternating current signal) at an operating frequency matching the operating parameters of the nondestructive inspection sensor 210 using the high-voltage direct current power from the capacitor 224. In some such embodiments, the signal generator 228 is further connected to the output module 230 via a reference connection 231 to facilitate comparison of the input and output signals of the nondestructive inspection sensor 210. In other embodiments without the signal generator 228, the nondestructive inspection sensor 210 may be configured to operate using direct current at a high-voltage level, or the nondestructive inspection sensor 210 may include a signal generator or similar element as part of the nondestructive inspection sensor 210.

When provided with a high-voltage power burst from the capacitor 224 through the electronic switch 226 (and, in some embodiments, the signal generator 228), the nondestructive inspection sensor 210 inspects the component to be inspected using an inspection signal 213 and generates an inspection result signal. An output of the nondestructive inspection sensor 210 is connected to the output module 230 to provide the inspection result signal for further analysis.

The output module 230 is disposed on the surface of the component to be inspected and is connected to the nondestructive inspection sensor 210 to receive the inspection result signal. The inspection result signal is generated by the receiving transducer 214 and is associated with the portion of the component inspected by the nondestructive inspection sensor 210. In some embodiments, the output module 230 contains circuitry or programmable logic to perform partial analysis on the received inspection result signal, such as comparing the received inspection result signal with a reference signal received via the reference connection 231. The output module 230 includes one or more of a data storage (e.g., a memory bank) and/or an output (e.g., a wireless transceiver) for providing data to an external computing device. For example, the output module 230 may be configured to store the received inspection result signal in a solid state memory until transmitted to an external receiver through wired or wireless data transfer.

In some embodiments, the output module 230 includes a wireless transmitter configured to transmit a wireless data signal 233 based upon the received inspection result signal to a wireless receiver 240. The output module 230 may be configured to transmit such wireless data signal 233 either in real-time as the inspection result signal is received or at a later time by storing the inspection result signal or data derived therefrom. In some embodiments the output module 230 is configured to transmit the wireless data signal 233 in response to a signal from the wireless receiver 240. The wireless receiver 240 may be any receiver capable of receiving wireless communication signals (e.g., an RFID receiver or NFC receiver). The wireless receiver 240 may be configured to further process or analyze the data or may be connected to a further computing device configured to perform such analysis.

In some embodiments, some or all of the elements of the intermittent inspection system 200 (excluding the wireless receiving 240) are disposed within one or more flexible films attached to the surface of the component to be inspected. An example of one such configuration is illustrated in FIG. 5 and discussed below. Such configurations are advantageous for ease of application and in limiting disruption to operation of the component to be inspected, particularly where airflow considerations are significant (e.g., on the surface of an aircraft). In some such embodiments, the nondestructive inspection sensor 210 and the power circuit 220 are disposed in such a flexible film and attached to the surface of a part of an aircraft body to enable inspection during flight, which part of the aircraft body is the component to be inspected by the nondestructive inspection sensor 210.

Figure 3:
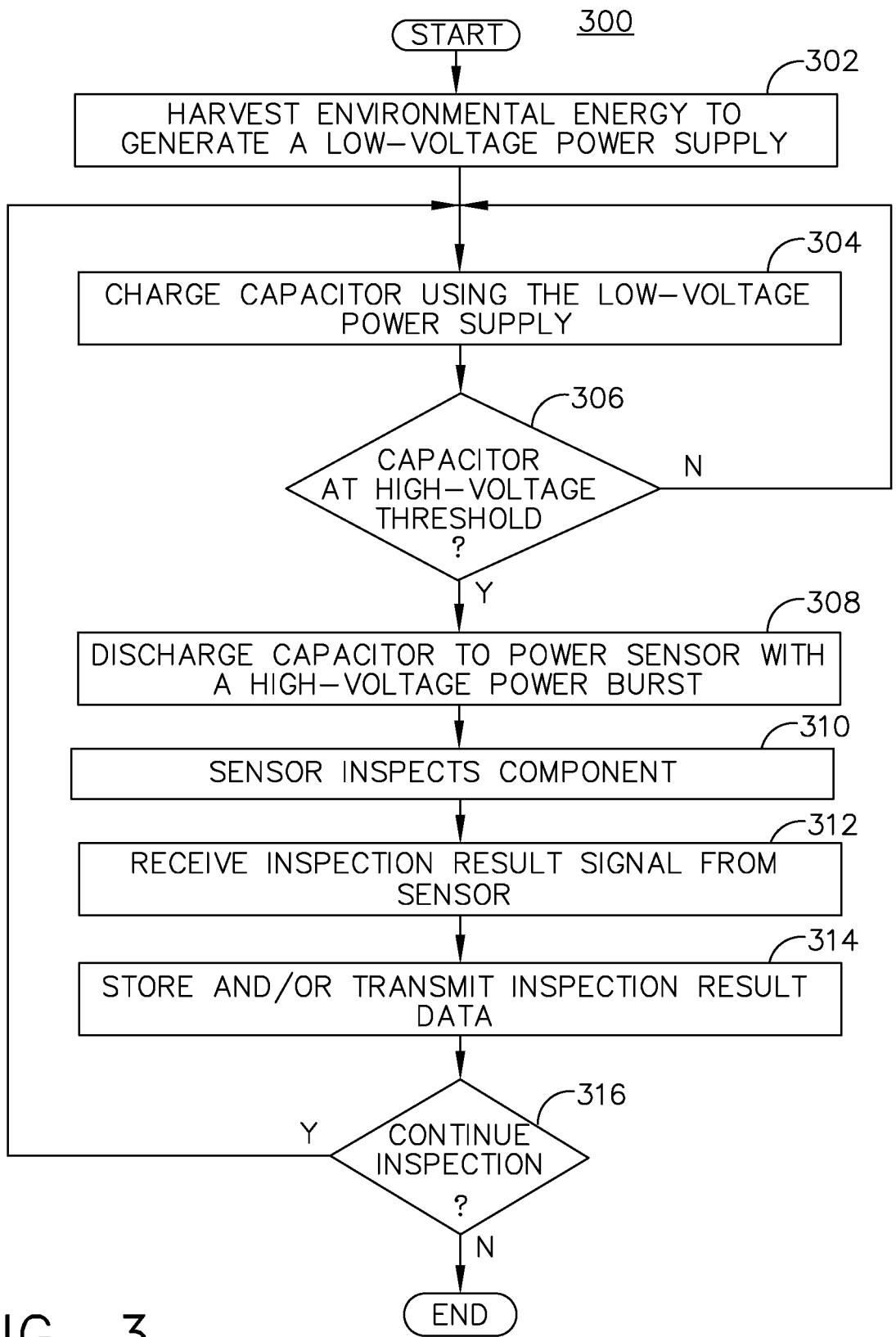
FIG. 3 illustrates a flow diagram of an intermittent inspection method using burst energy release to power a sensor.

FIG. 3 illustrates a flow diagram of an example of an intermittent inspection method 300 using burst energy release to power a sensor, such as the nondestructive inspection sensor 210. The intermittent inspection method 300 may be implemented using the intermittent inspection system 200, as described above. The intermittent inspection method 300 proceeds through a plurality of inspection cycles, each inspection cycle first proceeding through a charging interval in which the capacitor 224 is charged using the low-voltage power supply and is then discharged to provide the high-voltage power burst to the nondestructive inspection sensor 210. In some embodiments, the component to be inspected may be the component 502 (part of an aircraft body), as discussed below with respect to FIGS. 5A-B, such that operation occurs during flight (i.e., both the charging interval and the discharging interval occur during flight).

Figure 4:
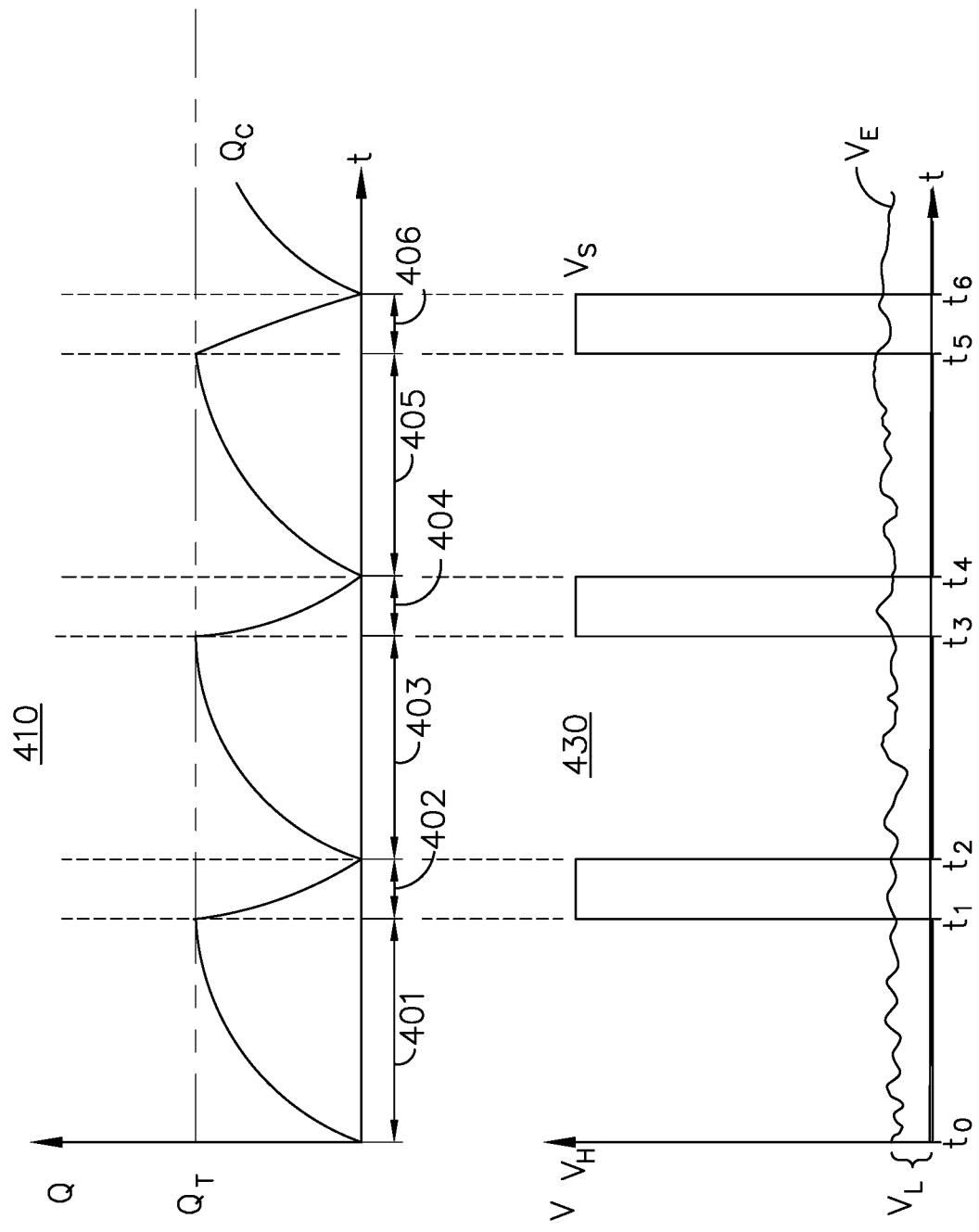
FIG. 4 illustrates a charge chart and voltage chart over multiple inspection cycles of intermittent inspection using burst energy release.

Throughout the intermittent inspection method 300, the environmental energy harvesting device 222 harvests environmental energy 223 and generates a low-voltage power supply (block 302). The environmental energy harvesting device 222 generates such low-voltage power supply continuously when the environmental energy 223 is available. Because the environmental energy 223 is variable over time in most environments, the low-voltage power supply is likewise variable, as illustrated in FIG. 4 below. Although the environmental energy harvesting device 222 continuously generates the low-voltage power supply, the power supply is insufficient to power the nondestructive inspection sensor 210 directly and continuously. Thus, the capacitor 224 is used to store the low-voltage power supply until a high-voltage power burst can be provided to the nondestructive inspection sensor 210.

The capacitor 224 is charged using the low-voltage power supply during a charging interval (block 304). The charging interval enables the gradual accumulation of charge in the capacitor 224 to a sufficient level to supply the high-voltage power burst during a discharging interval following the charging interval, as illustrated in FIG. 4 below. The charging interval may be fixed or may vary based upon the power generated by the environmental energy harvesting device 222. Whether fixed or variable, the capacitor 224 continues to charge during the charging interval until the accumulated charge reaches at least a charge associated with a high-voltage threshold (block 306). The durations of the charging interval and subsequent discharging interval are controlled by the state of the electronic switch 226 (i.e., whether the electronic switch 226 is open or closed). As described above, in some embodiments, the control module 250 controls opening and closing the electronic switch 226. In some such embodiments, the control module 250 controls the electronic switch 226 to close when the capacitor 224 reaches a charge associated with the high-voltage threshold and controls the electronic switch 226 to open when the capacitor 224 reaches a lower charge associated with a minimum-voltage threshold. Thus, the electronic switch 226 is opened and closed to provide both charging and discharging of the capacitor 224 to ensure sufficient high-voltage power is supplied to the nondestructive inspection sensor 210 in intermittent bursts.

When the electronic switch 226 is closed after the high-voltage threshold has been reached, the capacitor 224 discharges to power the nondestructive inspection sensor 210 with a high-voltage power burst during the discharging interval (block 308). As described above, in some embodiments, the capacitor 224 discharges to provide the high-voltage power burst to the signal generator 228, which converts the high-voltage power burst into a high-voltage signal that is supplied to the nondestructive inspection sensor 210. In some embodiments, the high-voltage power burst has a first voltage level that is at least two orders of magnitude greater than a first voltage level of the low-voltage power supply. For example, the high-voltage power burst may be 200V, while the low-voltage power supply may only generate power at 1.5V. Additionally or alternatively, in further embodiments, the charging interval has a first duration at least two orders of magnitude greater than a second duration associated with the discharging interval. For example, the charging interval may range from 120-900 seconds, while the discharging interval may be fixed at 2 seconds.

When the nondestructive inspection sensor 210 receives the high-voltage power burst (either directly or indirectly) from the capacitor 224, the nondestructive inspection sensor 210 inspects the component to be inspected (block 310). Inspecting the component includes transmitting the inspection signal 213 from the transmission transducer 212 at a first part of a surface of the component, which is received by the receiving transducer 214 at a second part of the surface of the component after propagation along or through a portion of the component. In some embodiments, the transmission transducer 212 and the receiving transducer 214 are both piezoelectric transducers, such that the inspection signal 213 is generated as a wave by motion of the transmission transducer 212 in response to an electrical signal and the receiving transducer 214 converts motion induced by the received inspection signal 213 into corresponding electrical signals. In further embodiments, the transmission transducer 212 and the receiving transducer 214 are configured to operate at ultrasonic frequencies. Thus, the inspection signal 213 is generated and received efficiently for component inspection. An inspection response signal is generated based upon the inspection signal 213 received by the receiving transducer 214, which may be a direct output signal (an analog electrical signal induced or generated in the receiving transducer as a response to the received inspection signal 213) or may be generated by the nondestructive inspection sensor 210 based upon such a direct output signal. In either case, the inspection response signal is provided at an output of the nondestructive inspection sensor 210 to the output module 230.

The output module 230 receives the inspection response signal from the nondestructive inspection sensor 210 at an output of the nondestructive inspection sensor 210 (block 312). Upon receiving the inspection response signal, in some embodiments, the output module 230 performs preliminary processing of the received inspection response signal. In some such embodiments, the output module 230 determines changes in the inspection signal 213 during propagation between the transmission transducer 212 and the receiving transducer 214 by comparison against a reference signal received from a signal generator 228 via the reference connection 231. Thus, inspection result data may be efficiently stored or transmitted by removing the baseline signal.

After performing any preliminary processing of the received inspection response signal, the output module 230 stores and/or transmits inspection result data associated with the inspection response signal (block 314). The inspection result data indicates (either directly or indirectly) a condition of the inspected portion of the component inspected by the nondestructive inspection sensor 210. In some embodiments, the output module 230 initially stores the inspection result data and later transmits the inspection result data for multiple inspection cycles to reduce energy used in transmission. Transmission of the inspection result data may be accomplished by either wired or wireless communication to an external computing device. In some embodiments, the output module 230 transmits the inspection result data in a wireless data signal 233 to a wireless receiver 240 for further storage and/or analysis, thereby eliminating the need for a direct physical communication connection between the output module 230 and the external computing device. Such wireless transmission may occur during or after inspection of the component.

The intermittent inspection method 300 may continue inspection of the component to be inspected through a plurality of inspection cycles of charging intervals and discharging intervals until the intermittent inspection system 200 loses power (e.g., environmental energy harvesting substantially ceases) or is controlled to stop operating (block 316). Thus, each inspection cycle includes both a charging interval and a discharging interval following the charging interval. In some embodiments, transmission of stored inspection result data occurs following discontinuation of inspection.

FIG. 4 illustrates a charge chart 410 and voltage chart 430 over multiple inspection cycles of intermittent inspection using burst energy release according to the intermittent inspection method 300 using the intermittent inspection system 200, as described above. Three full inspection cycles (and a portion of a fourth inspection cycle) are shown, each comprising a charging interval and a subsequent discharging interval. The first inspection cycle begins with a first charging interval 401 between times $t_0$ and $t_1$ immediately followed by first discharging interval 402 between time $t_1$ and $t_2$. A second inspection cycle follows, including a second charging interval 403 from time $t_2$ to time $t_3$ and second discharging interval 404 from time $t_3$ to time $t_4$. Likewise, a third inspection cycle follows in sequence, including a third charging interval 405 from time $t_4$ to time $t_5$ and third discharging interval 406 from time $t_5$ to time $t_6$.

The charge chart 410 illustrates the charge accumulated in the capacitor 224 over the inspection cycles. As shown, the capacitor charge $Q_C$ of the capacitor 224 increases during the first charging interval 401 until a charge $Q_T$ associated with a high-voltage threshold to enable the high-voltage power burst during the first discharge interval 402 to reach the high-voltage level $V_H$. After the capacitor charge $Q_C$ has reached the charge $Q_T$, the first charging interval 401 ends, and the capacitor charge $Q_C$ drops during the first discharging interval 402 as the capacitor 224 discharges to provide the high-voltage power burst. Similar charge accumulation and depletion occurs in each inspection cycle, as illustrated.

The voltage chart 430 illustrates the sensor voltage $V_S$ provided to the nondestructive inspection sensor 210 and the environmental voltage $V_E$ generated by the environmental energy harvesting device 222. As shown, the environmental voltage $V_E$ varies over time based upon fluctuations in the environmental energy 223, but the environmental voltage $V_E$ may be constant in some embodiments. In either case, the environmental voltage $V_E$ is in the low-voltage range $V_L$, which is substantially lower than the high-voltage level $V_H$ of the sensor voltage $V_S$ supplied to the nondestructive inspection sensor 210 during the first, second, and third discharging intervals 402, 404, 406. As further shown, the sensor voltage $V_S$ is zero or negligible during the first, second, and third charging intervals 401, 403, 405 when the electronic switch 226 is open. During the first, second, and third discharging intervals 402, 404, 406, however, the sensor voltage $V_S$ reaches the high-voltage level $V_H$ when the electronic switch 226 is closed, allowing the capacitor 224 to discharge through a high-voltage power burst.

It should be noted that these charts are exemplary only, and the magnitudes may not be drawn to scale. It should also be noted that the various intervals (particularly the first, second, and third charging intervals 401, 403, 405) may vary in duration due to operating conditions of the intermittent inspection system 200 (e.g., fluctuations in the environmental energy 223).

Figure 5A:
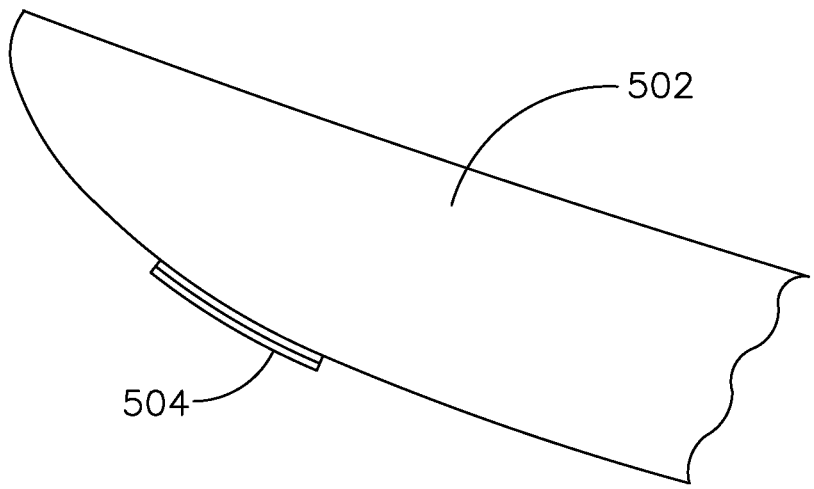
FIG. 5A illustrates a cross-section of an intermittent inspection system according to FIG. 2 disposed within a flexible film on a component to be inspected.
Figure 5B:
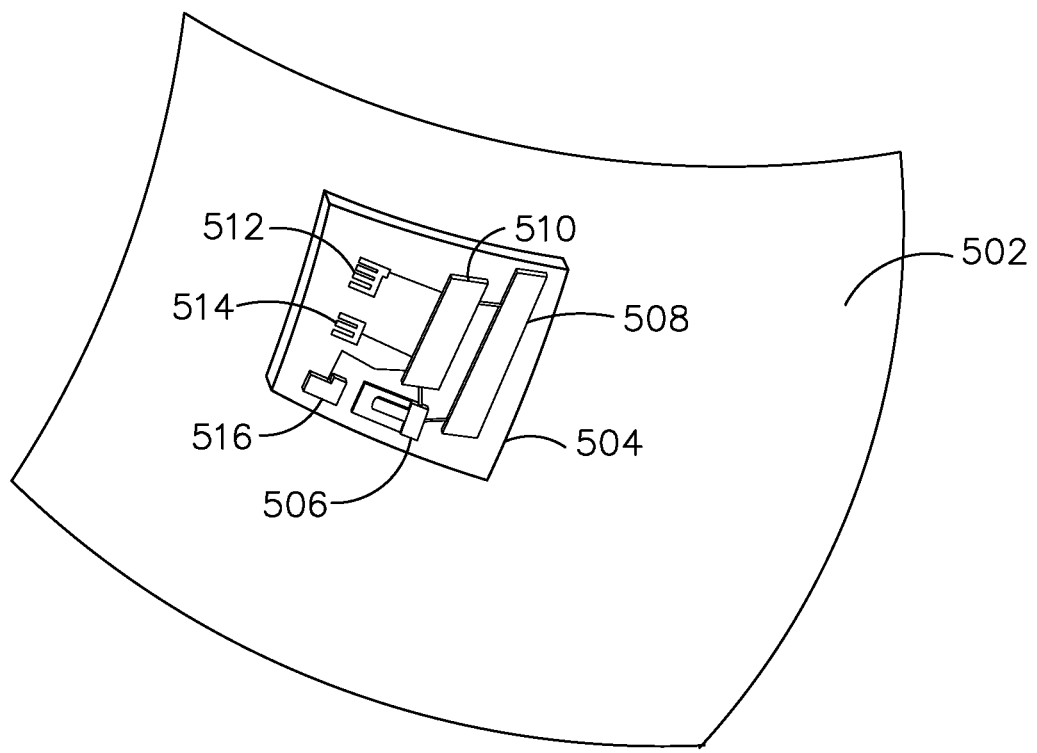
FIG. 5B illustrates a perspective view of the intermittent inspection system according to FIG. 5A.

FIGS. 5A and 5B illustrate an example configuration of the intermittent inspection system 200, as described above, disposed within a flexible film 504 on a component 502 to be inspected. FIG. 5A illustrates a cross-section of the component 502 and the flexible film 504. FIG. 5B illustrates a perspective view of the component 502 and the flexible film 504, showing various components of the system. Disposing the intermittent inspection system 200 within the flexible film 504 facilitates in situ monitoring while minimizing interruption of ordinary operation of the inspected component 502 or a system or structure of which it is a part. For example, in some embodiments, the component 502 is a part of an aircraft body (e.g., a wing or part of a fuselage). Disposing the intermittent inspection system 200 within the flexible film 504 in such embodiments enables inspection without significantly altering the airflow properties of the component 502.

As illustrated in FIG. 5A, the flexible film 504 attaches to and molds to the contour of the surface of the component 502. Various means of affixing the flexible film 504 to the component 502 may be used, depending upon the environmental conditions and inspection requirements. As illustrated in FIG. 5B, the flexible film 504 contains a plurality of distinct elements comprising the intermittent inspection system 200. The elements contained in the flexible film 504, as illustrated, include an environmental energy harvesting unit 506 (containing one or more environmental energy harvesting devices 222), a capacitor bank 508 (containing one or more capacitors 224), a control unit 510 (including or performing the functions of one or more of the electronic switch 226, the signal generator 228, the control module 250, and/or the output module 230), a write sensor transducer 512 (including the transmission transducer 212), a read sensor transducer 514 (including the receiving transducer 214), and an output unit 516 (including the output module 230 and/or a separate wireless transmitter).

The number, type, and configuration of such elements may vary between various embodiments, and those illustrated in FIG. 5B are presented as an example to aid understanding of the systems and methods disclosed herein. For example, in some embodiments, the flexible film 504 includes only the power circuit 220 of the intermittent inspection system 200 in order to operate with any attached nondestructive inspection sensor 210, such that the nondestructive inspection sensor 210 is not included in the flexible film 504. In such embodiments, the nondestructive inspection sensor 210 may instead by disposed within a separate flexible film, or the nondestructive inspection sensor 210 may be otherwise disposed on the surface of the component 502, such as by direct deposition on the surface to provide an improved contact with the component 502.

While various embodiments have been described above, this disclosure is not intended to be limited thereto. Variations can be made to the disclosed embodiments that are still within the scope of the appended claims.

What is claimed:

1. A method for intermittent inspection of a component, comprising:

generating, by an environmental energy harvesting device, a low-voltage power supply from environmental energy in an environment of the component;

charging a capacitor disposed on a surface of the component to a charge associated with a high-voltage threshold using the low-voltage power supply during a charging interval;

powering a nondestructive inspection sensor with a high-voltage power burst by discharging the capacitor during a discharging interval following the charging interval, wherein the nondestructive inspection sensor is disposed on the surface of the component and configured to transmit and receive an inspection signal that propagates along or through a portion of the component when powered; and receiving, at an output circuit, an inspection result signal associated with the portion of the component from the nondestructive inspection sensor.

2. The method of claim 1, wherein powering the nondestructive inspection sensor with the high-voltage power burst includes closing an electronic switch after the capacitor has reached the charge associated with the high-voltage threshold.

3. The method of claim 2, further comprising:
controlling, by a control module, the electronic switch to close when the capacitor reaches the charge associated with the high-voltage threshold; and
controlling, by the control module, the electronic switch to open when the capacitor reaches a minimum-voltage threshold.

4. The method of claim 1, further comprising:
transmitting, from a wireless transmitter of the output circuit to a wireless receiver, a wireless data signal based upon the inspection result signal.

5. The method of claim 1, further comprising:
receiving, at the nondestructive inspection sensor, the high-voltage power burst during the discharging interval;
transmitting, by a transmission transducer of the nondestructive inspection sensor, the inspection signal at a first part of the surface of the component; and
receiving, by a receiving transducer of the nondestructive inspection sensor, the inspection signal at a second part of the surface of the component.

6. The method of claim 5, wherein the transmission transducer and the receiving transducer are piezoelectric transducers configured to operate at ultrasonic frequencies.

7. The method of claim 1, wherein:
the high-voltage power burst has a first voltage level that is at least two orders of magnitude greater than a first voltage level of the low-voltage power supply; and
the charging interval has a first duration at least two orders of magnitude greater than a second duration associated with the discharging interval.

8. The method of claim 1, wherein the component is a part of an aircraft body, and wherein both the charging interval and the discharging interval occur during flight.

9. An intermittent inspection system, comprising:
an environmental energy harvesting device disposed on a surface of a component and configured to generate a low-voltage power supply from environmental energy in an environment of the component;
a capacitor disposed on the surface of the component and connected to the environmental energy harvesting device;
an electronic switch disposed on the surface of the component and connected to the capacitor, wherein the electronic switch is configured to control charging and discharging of the capacitor such that: (i) while the electronic switch is open during a charging interval, the capacitor charges to at least a charge associated with a high-voltage threshold using the low-voltage power supply from the environmental energy harvesting device, and (ii) while the electronic switch is closed during a discharging interval following the charging interval, the capacitor discharges a high-voltage power burst through the electronic switch;

a nondestructive inspection sensor disposed on the surface of the component and connected to the electronic switch, wherein the nondestructive inspection sensor is configured to transmit and receive an inspection signal that propagates along or through a portion of the component when powered by the high-voltage power burst from the capacitor through the electronic switch; and an output circuit disposed on the surface of the component and connected to the nondestructive inspection sensor, wherein the output circuit is configured to receive an inspection result signal associated with the portion of the component from the nondestructive inspection sensor.

10. The intermittent inspection system of claim 9, wherein the environmental energy harvesting device is an electromechanical device configured to generate the low-voltage power supply from vibrations of the component.

11. The intermittent inspection system of claim 9, wherein the capacitor comprises a plurality of graphene layers stacked in a flexible film attached to the surface of the component and configured to operate as a capacitor bank.

12. The intermittent inspection system of claim 9, wherein all of the environmental energy harvesting device, the capacitor, the electronic switch, the nondestructive inspection sensor, and the output circuit are disposed within one or more flexible films attached to the surface of the component.

13. The intermittent inspection system of claim 9, further comprising:
a control module disposed on the surface of the component and connected to the electronic switch to control opening and closing the electronic switch.

14. The intermittent inspection system of claim 9, wherein the nondestructive inspection sensor comprises:
a transmission transducer configured to generate the inspection signal at a first part of the surface of the component as an ultrasonic pulse, wherein the transmission transducer is a piezoelectric transducer; and
a receiving transducer configured to receive the inspection signal at a second part of the surface of the component, wherein the receiving transducer is a piezoelectric transducer.

15. The intermittent inspection system of claim 9, wherein the output circuit comprises a wireless transmitter configured to transmit a wireless data signal based upon the inspection result signal to a wireless receiver.

16. A power circuit for intermittently powering a nondestructive inspection sensor, comprising:
an environmental energy harvesting device disposed on a surface of a component and configured to generate a low-voltage power supply from environmental energy in an environment of the component;
a capacitor disposed on the surface of the component and connected to the environmental energy harvesting device; and
an electronic switch disposed on the surface of the component and connected to the capacitor, wherein the electronic switch is configured to control charging and discharging of the capacitor such that: (i) while the electronic switch is open during a charging interval, the capacitor charges to at least a charge associated with a high-voltage threshold using the low-voltage power supply from the environmental energy harvesting device, and (ii) while the electronic switch is closed during a discharging interval following the charging interval, the capacitor discharges a high-voltage power burst to the nondestructive inspection sensor through the electronic switch.

17. The power circuit of claim 16, wherein the environmental energy harvesting device is an electromechanical device configured to generate the low-voltage power supply from vibrations of the component.

18. The power circuit of claim 16, wherein the capacitor comprises a plurality of graphene layers stacked in a flexible film attached to the surface of the component and configured to operate as a capacitor bank.

19. The power circuit of claim 16, further comprising:
a control module disposed on the surface of the component and connected to the electronic switch to control opening and closing the electronic switch.

20. The power circuit of claim 16, wherein:
the component is a part of an aircraft body; and
all of the environmental energy harvesting device, the capacitor, and the electronic switch are disposed within one or more flexible films attached to the surface of the part of the aircraft body.

* * * * *